(12) United States Patent
Tsujita et al.

(10) Patent No.: US 8,049,191 B2
(45) Date of Patent: Nov. 1, 2011

(54) METHOD OF TRANSFERRING PATTERN OF RETICLE, COMPUTER READABLE STORAGE MEDIUM, AND METHOD OF MANUFACTURING DEVICE

(75) Inventors: Kouichirou Tsujita, Utsunomiya (JP); Koji Mikami, Nikko (JP); Hiroyuki Ishii, Shioya-gun (JP)

(73) Assignee: Canon Kabushiki Kaisha, Tokyo (JP)

( * ) Notice: Subject to any disclaimer, the term of this patent is extended or adjusted under 35 U.S.C. 154(b) by 182 days.

(21) Appl. No.: 12/607,015

(22) Filed: Oct. 27, 2009

(65) Prior Publication Data
US 2010/0102255 A1    Apr. 29, 2010

(30) Foreign Application Priority Data
Oct. 29, 2008 (JP) ................................ 2008-278611

(51) Int. Cl.
*G21K 5/10* (2006.01)
(52) U.S. Cl. ................ 250/492.22; 250/492.23; 355/67; 355/52
(58) Field of Classification Search .................. 250/318, 250/492.22, 492.23, 492.3, 559.19, 559.2; 355/35, 47, 52, 55, 67, 74, 77
See application file for complete search history.

(56) References Cited

U.S. PATENT DOCUMENTS

| | | | |
|---|---|---|---|
| 6,774,043 B2* | 8/2004 | Yamaguchi et al. | 438/705 |
| 7,518,704 B2* | 4/2009 | Kim et al. | 355/67 |
| 2002/0153496 A1* | 10/2002 | Hirayanagi | 250/492.23 |
| 2005/0259234 A1* | 11/2005 | Hirukawa et al. | 355/53 |
| 2006/0192933 A1* | 8/2006 | Kim et al. | 355/67 |
| 2007/0013896 A1* | 1/2007 | Tsujita | 355/77 |
| 2009/0310116 A1* | 12/2009 | Tsujita et al. | 355/77 |
| 2010/0290020 A1* | 11/2010 | Mori | 355/67 |

OTHER PUBLICATIONS

L.Van Look, et al, "Tool-to-tool optical proximity effect matching", Proc. of SPIE, vol. 6924, 69241Q 1-12, (2008).

"Toward a Breakthrough of Real-coded Genetic Algorithms", Proceedings of Symposium on Evolutionary Computation 2007, (Date: Dec. 27-28, 2007; Venue: Hokkaido Toya Lake), Society for Evolutionary Computation.

* cited by examiner

*Primary Examiner* — Bernard E Souw
(74) *Attorney, Agent, or Firm* — Canon U.S.A., Inc., IP Division

(57) ABSTRACT

A method includes setting a target pattern to be formed on a substrate using a reticle, obtaining a first pattern using the reticle and a first illumination condition, calculating, a second illumination condition under which the target pattern is transferred onto the substrate using the reticle, and a third illumination condition under which the first pattern is transferred onto a substrate using the reticle, using mathematical models each of which defines the relationship between an illumination condition and a virtual pattern transferred onto a substrate using the illumination condition, determining a fourth illumination condition, obtained by adding the difference between the calculated second illumination condition and third illumination condition to the first illumination condition, as the illumination condition, and transferring the pattern of the reticle onto the substrate by illuminating the reticle using the determined illumination condition.

10 Claims, 13 Drawing Sheets

FIG. 1B
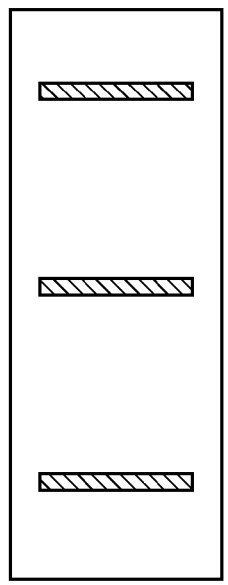
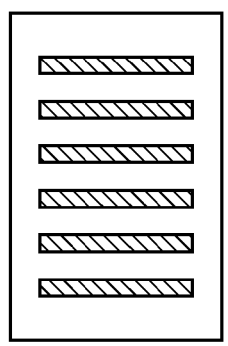
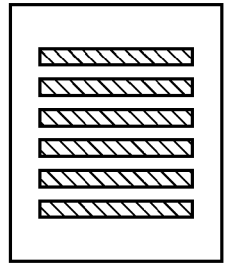

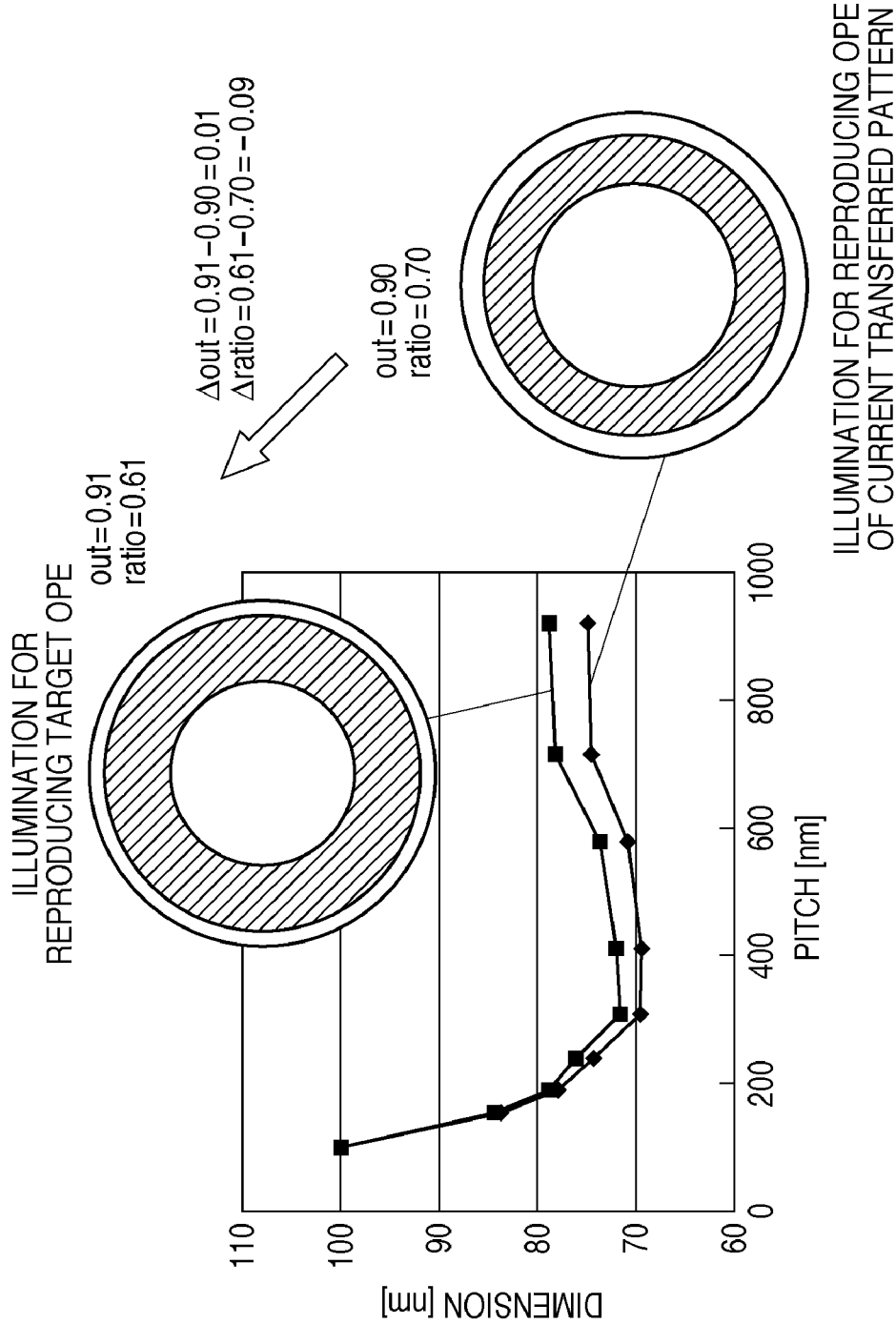

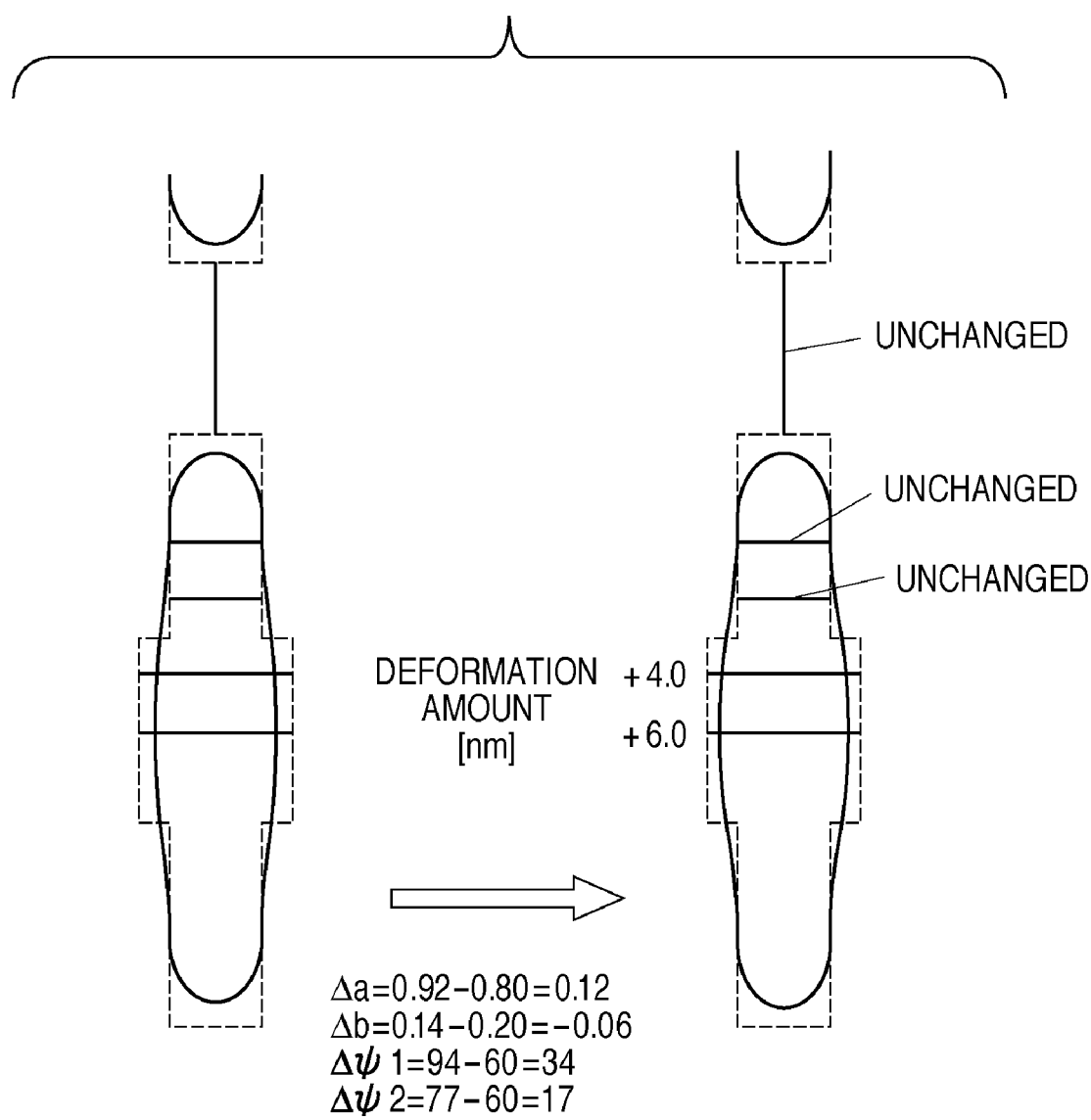

F I G. 3D
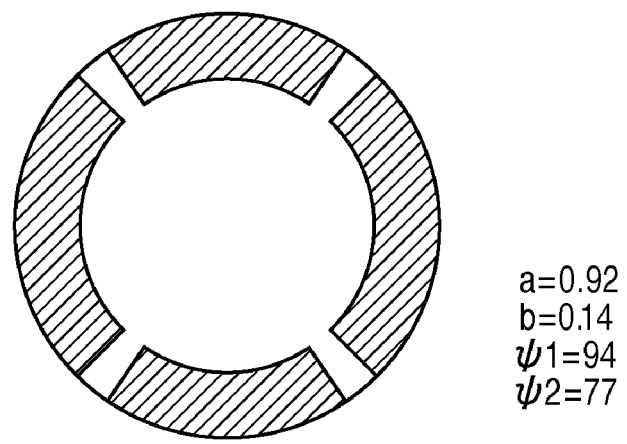
a=0.92
b=0.14
ψ1=94
ψ2=77
F I G. 4
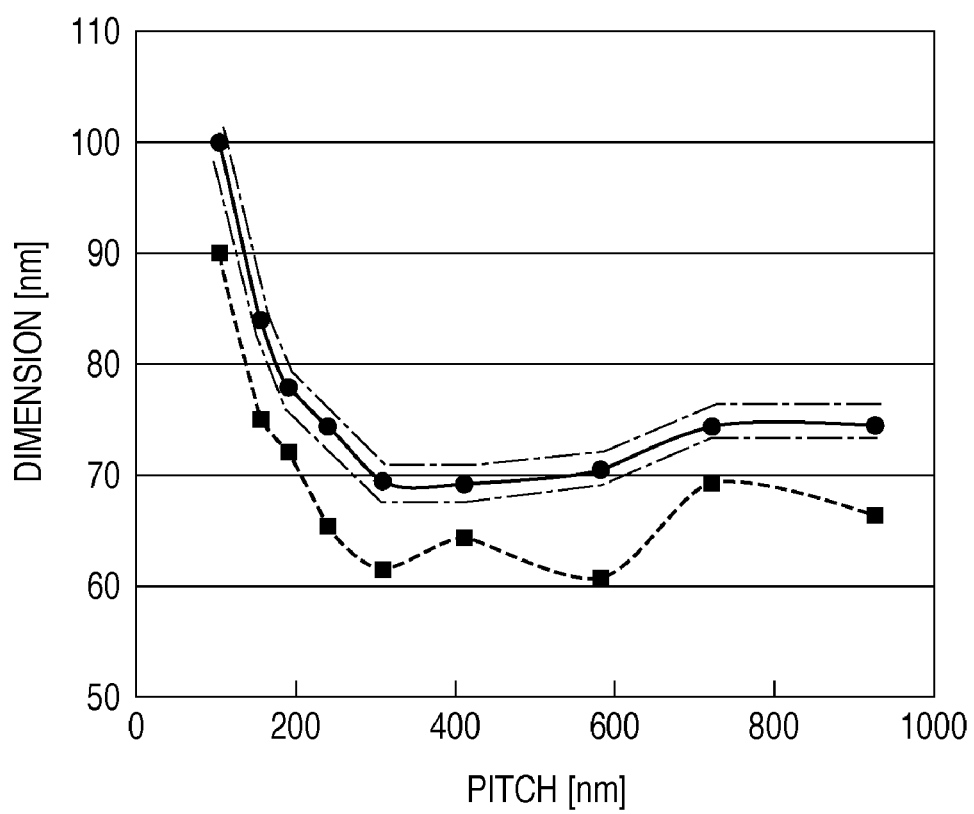

METHOD OF TRANSFERRING PATTERN OF RETICLE, COMPUTER READABLE STORAGE MEDIUM, AND METHOD OF MANUFACTURING DEVICE

BACKGROUND OF THE INVENTION

1. Field of the Invention

The present invention relates to a method of transferring a pattern of a reticle onto a substrate, a computer readable storage medium, and a method of manufacturing a device.

2. Description of the Related Art

In a lithography process for manufacturing a semiconductor, predetermined patterning is performed using a reticle (mask). Note, however, that when a new exposure apparatus is introduced into this process, it usually has a performance different from that of the existing exposure apparatus. For this reason, to obtain a transfer pattern identical to that obtained by the conventional exposure apparatus, the new exposure apparatus is to be adjusted.

Also, to improve the device characteristics, the current transfer pattern may be slightly modified. Ideally, in this case, it would be tempted to fabricate another reticle suited to that improvement. However, from the standpoint of practicality, it would better to form a target pattern by adjusting the exposure apparatus, instead of fabricating another expensive reticle for such a slight modification.

Exposure parameters which influence the pattern shape on a substrate (wafer) include, for example, the illumination intensity distribution, lens numerical aperture (NA), lens aberration, and light source wavelength bandwidth. Of these exposure parameters, the most influential one is the illumination condition such as the illumination mode. Although the NA is relatively influential, it has only one numeric parameter. This makes it difficult to partially adjust the NA and undesirably changes the resolving performance. Although the aberration is relatively influential as well, a leading-edge exposure apparatus has less aberration and its contribution ratio is therefore low. Under the circumstances, it is a common practice to achieve the foregoing object by adjusting the illumination condition.

There are the following two working methods of deforming a transfer pattern to have a certain target value. In the following description, the illumination mode is assumed to be generally represented by numeric parameters. For example, annular illumination is represented by the outer σ and the inner σ.

[Method 1]

First, the rate of dimensional change (to be referred to as the "sensitivity" hereinafter) in response to a change in parameter in each illumination mode is obtained for each evaluation point. Then, the amount of change from the current dimension to the target dimension at each evaluation point is divided by the sensitivity to obtain a parameter value to be changed in each illumination mode. In this case, the amount of dimensional change typically has a level on the order of several nanometers, and no large error is generated in this range even if the sensitivity is assumed to be linear. Although the sensitivity is easily obtained by optical image computation, a difference naturally occurs between an experimental value and the computed value. In view of this, a method of actually slightly changing the illumination condition and measuring the dimension experimentally is commonly employed. Details of this method are described in Proc. of SPIE, Vol. 6924, 6924Q 1-12.

[Method 2]

The contour of the pattern on the wafer is computed under a certain illumination condition. The RMS (Root Mean Square) or maximum value of a set of the differences between the values representing the computed contour and the target values at a plurality of pattern adjustment positions is obtained. The obtained value is set as an index value. Next, the illumination condition is slightly changed, and an index value is obtained for the changed illumination condition. By repeating this sequence in the space to set the illumination condition, an illumination condition under which the index value is minimum is obtained. To obtain that illumination condition, a mathematical method such as a genetic algorithm method or a Monte Carlo method is used. Details of this method are described in Shigenobu Kobayashi, "Toward A Breakthrough of Real-coded Genetic Algorithms", Proceedings of Symposium on Evolutionary Computation 2007 (Date: Dec. 27-28, 2007; Venue: Hokkaido Toya Lake), Society for Evolutionary Computation.

The contour of the pattern on the wafer is computed by optical computation or resist image computation. Note that in this technical field, resist image computation is basically used because of the necessity of matching with the experimental results.

Resist image computation includes a scheme of physically precisely computing a resist image, and a scheme of computing a resist image based on correlation between an experimental value and the computed value of an optical image. The former scheme has the demerit of consuming a relatively long computation time, so the present invention employs the latter scheme which consumes a relatively short computation time and has features to be described later.

The computation method which uses a resist image will be explained herein. First, several types of model extraction patterns having simple line-and-space structures and line ends are selected as patterns to be transferred and measured experimentally. Although only several types of model extraction patterns are selected, they each have several tens to several hundreds of different line widths, space widths, and line end widths.

The image log slopes (ILSs) and the curvatures at feature points on these model extraction patterns are computed from their optical images.

The ILSs are defined by:

$$ILS = d\ln(I)/dx$$

where I is the light intensity, and x is the position.

The curvatures are computed by dividing the contour into small curves, fitting them by parts of circles, and determining the radii of the circles as the curvatures. A difference δ between the computed value of an optical image and an experimental value at each of the feature points is expressed by:

$$\delta = a \times \text{curvature} + b \times \text{ILS} + c$$

where a, b, and c are constants.

These values are fitted for all evaluation points to determine the constants a, b, and c. Construction of this relation is commonly called model construction. When the model is determined, the above-mentioned difference is determined by computing the ILS and the curvature from the optical image at an arbitrary position on the pattern, and the resist pattern dimension is then calculated.

In method 1, if a plurality of evaluation points are present, different illumination condition optimum solutions are sometimes obtained at these evaluation points. In this case, an averaging process or a weighting process, for example, is performed. However, such a process rarely has a physical ground, so the overall matching accuracy at all evaluation points is inevitably decreased. It is also necessary to define the contribution ratios of a plurality of existing illumination conditions. Such a process rarely has a physical ground as well, so the overall matching accuracy at all evaluation points is again inevitably lowered.

In method 2, an illumination condition under which the transfer pattern is closest to a target value is mathematically obtained. The calculated solution therefore should be theoretically correct. Despite this expectation, the practical application of the calculation result obtained in method 2 is not free from errors due to, for example, computational errors of a resist image used in a mathematical process, and deviations between the numerical definition of the illumination condition and the setting of an actual exposure apparatus.

SUMMARY OF THE INVENTION

The present invention has been made in consideration of the above-described situation, and accurately, easily determines the illumination condition of a reticle in a lithography process including a step of transferring the pattern of the reticle onto a substrate.

According to an aspect of the present invention, there is provided a method of transferring a pattern of a reticle onto a substrate, the method comprising: setting a target pattern to be formed on the substrate using the reticle; obtaining a first pattern transferred onto a substrate by exposure using the reticle and a first illumination condition; calculating, a virtual second illumination condition under which the target pattern is transferred onto a substrate using the reticle, and a virtual third illumination condition under which the first pattern is transferred onto a substrate using the reticle, using mathematical models each of which defines a relationship between an illumination condition and a virtual pattern transferred onto a substrate using the illumination condition; determining a fourth illumination condition, obtained by adding a difference between the calculated second illumination condition and third illumination condition to the first illumination condition, as an illumination condition under which the target pattern is transferred onto a substrate using the reticle; and transferring the pattern of the reticle onto the substrate by illuminating the reticle using the determined illumination condition.

Further features of the present invention will become apparent from the following description of exemplary embodiments with reference to the attached drawings.

BRIEF DESCRIPTION OF THE DRAWINGS

FIG. 1B is a view showing a reticle used;

FIG. 2 is a schematic graph illustrating an example in which the illumination condition is optimized by OPE evaluation;

FIG. 3C is a view showing a transfer pattern and a target pattern;

FIG. 3D is a view showing illumination used to transfer a target pattern;

FIG. 4 is a graph showing the allowable range of a dimension error from a target pattern;

DESCRIPTION OF THE EMBODIMENTS

A method of determining the illumination condition of a reticle in a lithography process including a step of transferring the pattern of the reticle onto a substrate by an exposure apparatus will be described below. Note that the illumination condition includes the light intensity distribution (effective light source) on the pupil plane of an illumination (projection) optical system.

Figure 1A:
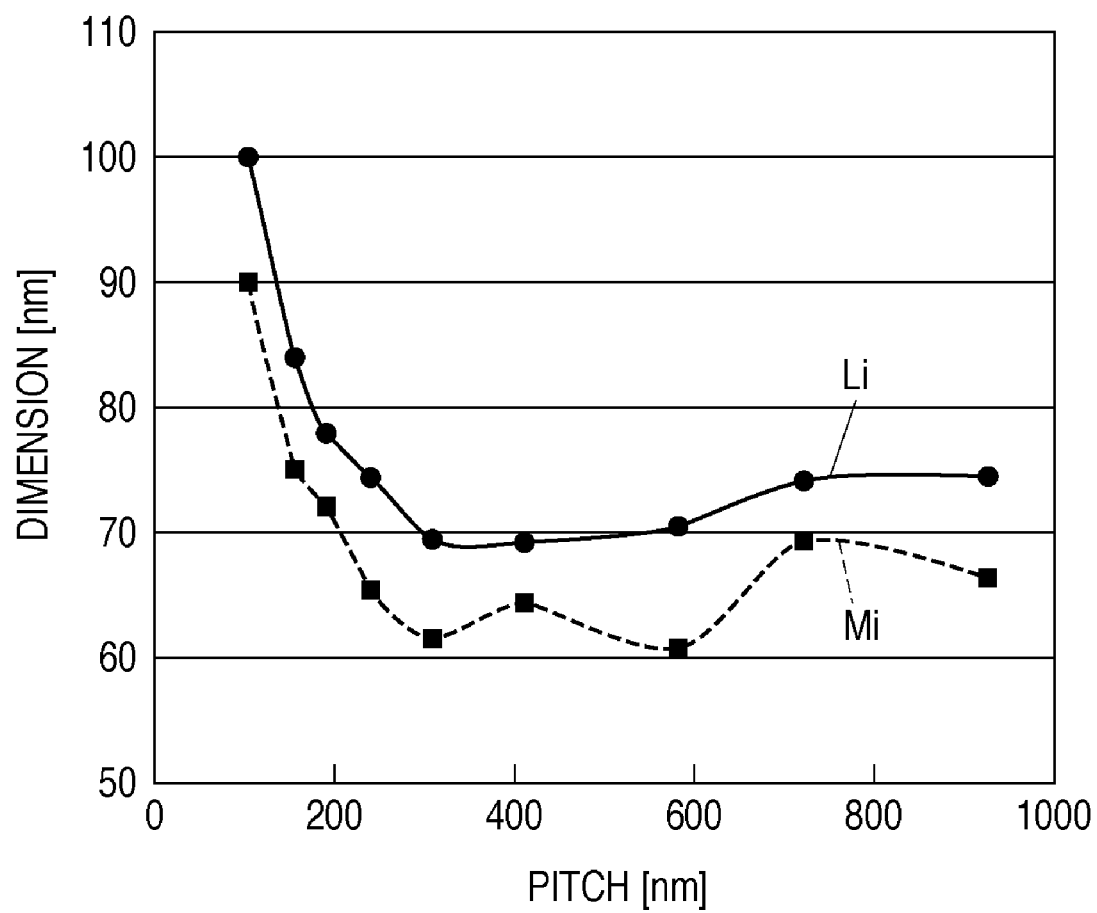
FIG. 1A is a graph showing a transfer pattern and a target pattern.

In a first embodiment, conceptual description will be given first with reference to FIG. 1A. A dotted line in FIG. 1A describes a first pattern (transfer pattern) transferred onto a substrate by actual exposure under a first illumination condition A using a reticle. A solid line in FIG. 1A describes a target pattern to be formed on a substrate using the same reticle as used in the former transfer. In one embodiment, the calculation target is an illumination condition B under which the target pattern is transferred onto a substrate using the same reticle. Note that a plurality of types (e.g., nine types in FIG. 1A) of reticle patterns having a plurality of lines with different pitches are used, as shown in FIG. 1B. The ordinate in FIG. 1A indicates the dimension of a line positioned at the center of each transfer pattern.

A virtual third illumination condition for reproducing the transfer pattern [Dimension $M_i$; $i=1, \ldots, n$] (a dotted line in FIG. 1A) transferred under the first illumination condition A is calculated using a mathematical model. The calculated third illumination condition is determined as A'. The third illumination condition A' is a virtual illumination condition under which the first pattern is transferred onto a substrate. Normally, the first illumination condition A and the virtual third illumination condition A' do not perfectly match each other due to, for example, a resist image computation error and a deviation between the numerical definition of the illumination mode and the setting of an actual exposure apparatus.

A virtual second illumination condition for reproducing the target pattern [Dimension $L_i$; $i=1, \ldots, n$] (a solid line in FIG. 1A) is calculated using a mathematical model. The calculated second illumination condition is determined as B'.

The second illumination condition B' is a virtual illumination condition under which the target pattern is transferred onto a substrate. The second illumination condition B' can never match the illumination condition B which directly attains the target pattern due to, for example, a resist image computation error and a deviation between the numerical definition of the illumination mode and the setting of an actual exposure apparatus, as described above.

The mathematical models used to calculate the virtual third illumination condition A' and the second illumination condition B' each are a model which defines the relationship between an illumination condition for model extraction, and a virtual pattern transferred onto a substrate using the illumination condition. An example of this model is a resist image computation model. Although the absolute value of a resist image computation error has no perfectly proportional relationship with a change in illumination condition, the difference in resist dimension has a proportional relationship with a minute change in illumination condition. Likewise, the difference in deviation between the numerical definition of the illumination mode and the setting of an actual exposure apparatus has a nearly proportional relationship with a change in illumination condition as long as this change is not so large.

From the foregoing, the difference between the third illumination condition A' and the second illumination condition B' serves to eliminate these errors. Also, this difference equals a difference (Li−Mi) between the dimension Li of the target pattern transferred onto a substrate under the illumination condition B and the dimension Mi of the transfer pattern actually transferred under the first illumination condition A. Accordingly, this difference is accurately approximated by the dimensional difference between a virtual target pattern formed under the second illumination condition B' and a virtual transfer pattern formed under the third illumination condition A'.

Hence, a fourth illumination condition B under which the target pattern is transferred onto a substrate can be determined by adding the difference between the second illumination condition B' and the third illumination condition A' to the first illumination condition A. This is possible especially because the difference between the current transfer pattern and the target pattern and that between the current illumination condition and the illumination condition which attains the target pattern are not so large.

Figure 1C:
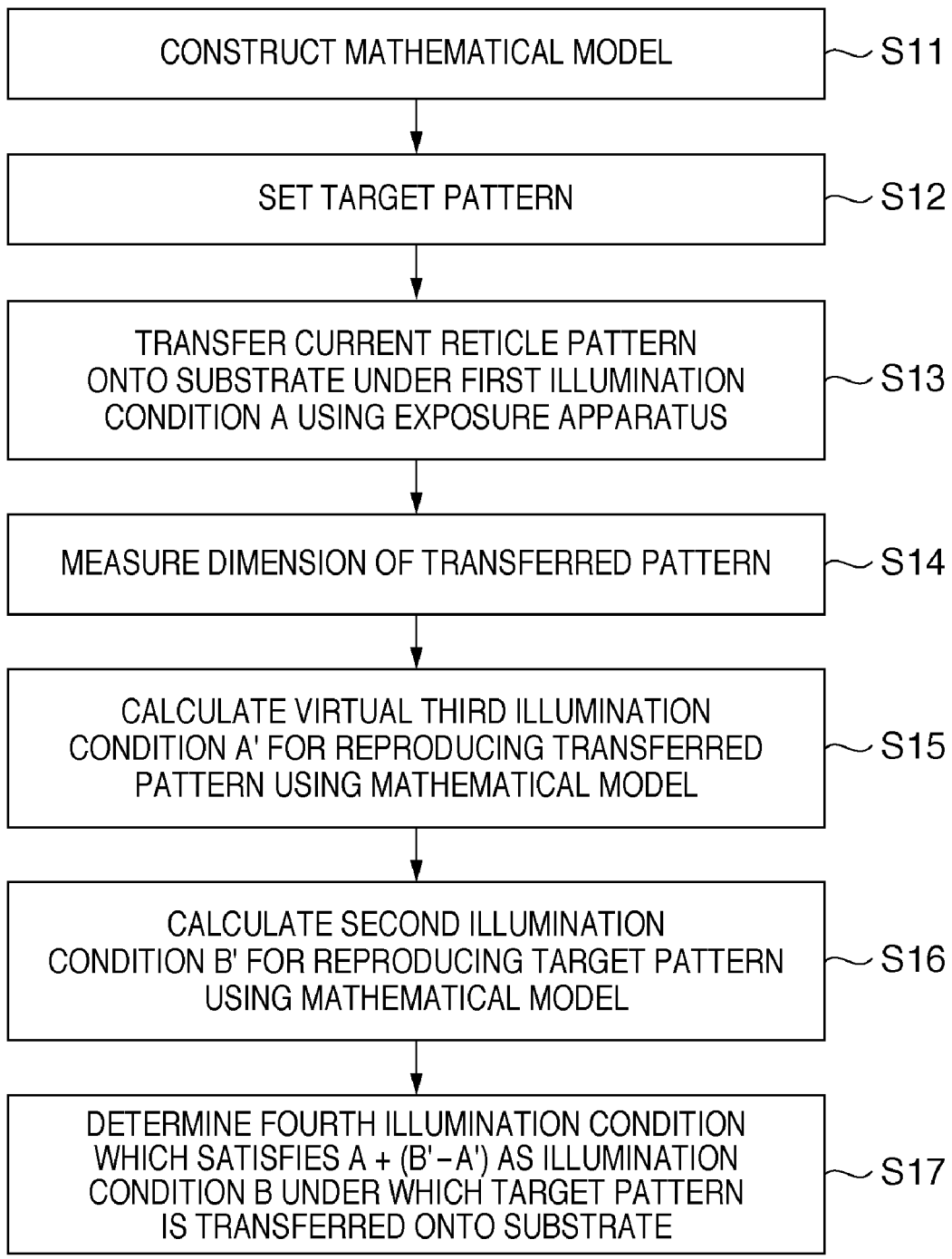
FIG. 1C is a flowchart showing a sequence of determining the illumination condition under which a target pattern is transferred.

A sequence of determining an illumination condition B under which a target pattern is transferred onto a substrate will be explained with reference to FIG. 1C.

In step S11, a mathematical model used to obtain an illumination condition for reproducing a transfer pattern is constructed on the computer. Instead, a mathematical model may be constructed in advance separately. In this case, step S11 is omitted from the flowchart. In step S12, the computer sets a reticle target pattern to be transferred onto a substrate.

In step S13, the computer obtains a first pattern formed by transferring the pattern of a reticle onto a substrate under the current first illumination condition A using the current exposure apparatus. In step S14, the computer obtains the result of measuring the dimension of the current transfer pattern (first pattern). In step S15, the computer calculates a virtual third illumination condition A' for reproducing the current transfer pattern, based on the measured dimension of the current transfer pattern, using a mathematical model. The mathematical model can be, for example, a model which uses a genetic algorithm or a Monte Carlo algorithm.

In step S16, the computer obtains/calculates a virtual second illumination condition B' for reproducing the target pattern, based on the dimension of the target pattern, using a mathematical model. In step S17, the computer adds the difference between the second illumination condition B' and the third illumination condition A' to the first illumination condition A. The computer determines a fourth illumination condition B which satisfies A+(B'−A') as the illumination condition under which the target pattern is transferred onto a substrate.

A concrete example will be explained hereinafter. Reticle patterns used to form a transfer pattern and a target pattern are line-and-space patterns, as shown in FIG. 1B. A pattern group including nine types of patterns with a fixed line dimension of 100 nm and different line pitches (spaces) of 104 nm to 924 nm is selected, and annular illumination is adopted.

Such evaluation is commonly called OPE (Optical Proximity Effect) evaluation. FIG. 2 illustrates an example of patterns used and the illumination condition optimization results. The outer σ (σ-out) and the ratio of the inner σ to the outer σ (σ-ratio) are used herein as parameters which describe annular illumination. FIG. 2 describes two graph lines. The lower graph line describes the OPE of the current transfer pattern, and its right side view shows a virtual third illumination condition for reproducing the current transfer pattern. In one embodiment, the third illumination condition is defined by σ-out=0.90 and σ-ratio=0.70. The upper graph line describes the OPE of the target pattern, and its upper side view shows a virtual second illumination condition for reproducing the target pattern. The second illumination condition is defined by σ-out=0.91 and σ-ratio=0.61. Each of these illumination conditions is calculated using a mathematical model. A fourth illumination condition under which the target pattern is transferred onto a substrate can be calculated by adding differences, between these two illumination conditions, Δσ-out=0.91−0.90=0.01 and Δσ-ratio=0.61−0.70=−0.09 to the current first illumination condition.

The computer can execute a process for determining an illumination condition B, under which a target pattern is transferred onto a substrate, by storing a program for executing the process from step S12 to step S17 in a storage medium of the computer. Also, the computer can execute a process for determining an illumination condition B, under which a target pattern is transferred onto a substrate, by reading the program code from a recording medium which records the program.

Figure 3A:
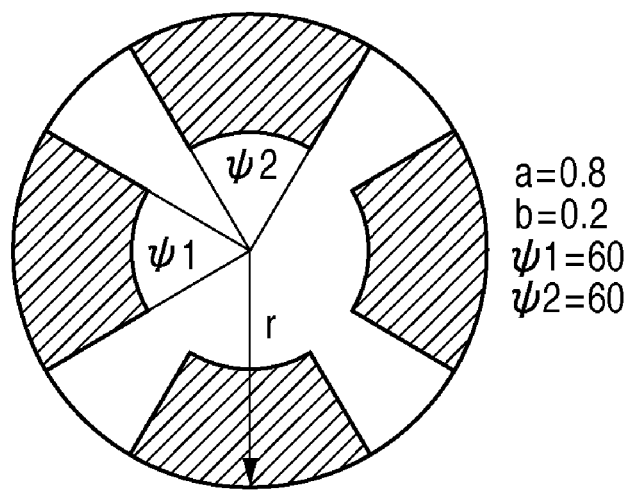
FIG. 3A is a view showing illumination used to form a transfer pattern.
Figure 3B:
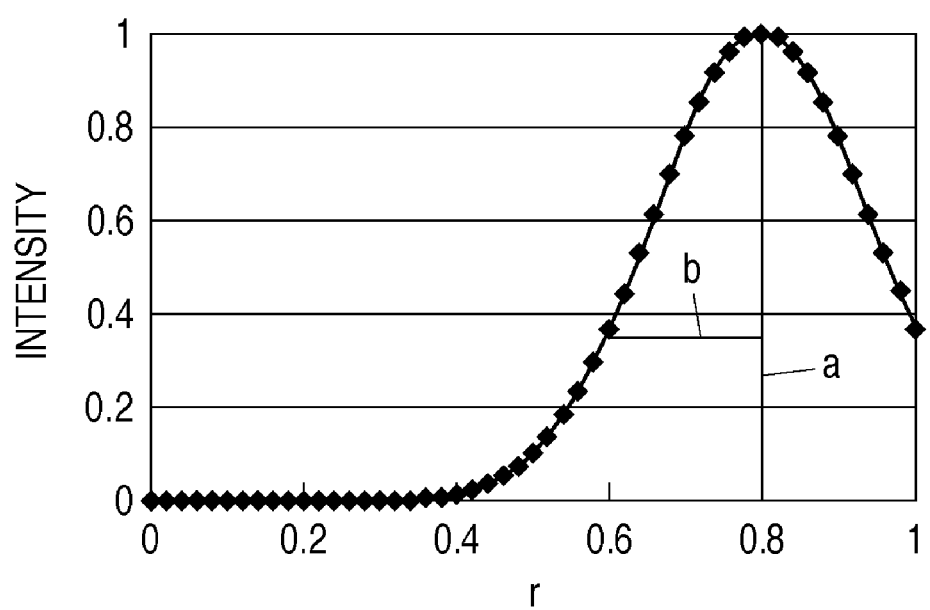
FIG. 3B is a graph illustrating the intensity distribution of the illumination shown in FIG. 3A.

FIGS. 3A to 3D illustrate an example in which two-dimensional rectangular patterns are used as reticle patterns used to form a transfer pattern and a target pattern, and cross-pole illumination is adopted. This illumination exhibits a two-dimensional distribution shown in FIG. 3A, and exhibits an intensity distribution shown as a sectional view in FIG. 3B. In FIG. 3B, the abscissa indicates the position (r) in the radial direction in the illumination shown in FIG. 3A, and the ordinate indicates the intensity of the illumination. The intensity distribution herein approximately follows a Gaussian function. A central position a, width b, angular aperture (horizontal) $\Psi 1$, and angular aperture (vertical) $\Psi 2$ of the intensity distribution are used as parameters which describe the illumination.

The left side view in FIG. 3C shows a transfer pattern (first pattern) transferred under the current first illumination condition. A virtual third illumination condition for reproducing the transfer pattern is defined by a=0.8, b=0.2, $\Psi 1$=60, and $\Psi 2$=60, as shown in FIG. 3A. The right side view in FIG. 3C shows a target pattern. FIG. 3D shows a virtual second illumination condition for reproducing the target pattern. The target pattern has central dimensions longer than those of the current transfer pattern by 4 nm and 6 nm, and other dimensions equal to those of the current transfer pattern. A virtual second illumination condition for reproducing the target pattern is defined by a=0.92, b=0.14, Ψ1=94, and Ψ2=77, as shown in FIG. 3D. Each of these illumination conditions is calculated using a mathematical model.

Differences Δa, Δb, ΔΨ1, and ΔΨ2 between these two illumination conditions are calculated as:

$$\Delta a = 0.92 - 0.80 = 0.12$$

$$\Delta b = 0.14 - 0.20 = -0.06$$

$$\Delta\Psi 1 = 94 - 60 = 34$$

$$\Delta\Psi 2 = 77 - 60 = 17$$

A fourth illumination condition under which the target pattern can be transferred onto a substrate can be determined by adding the obtained differences to the current illumination condition.

Two virtual illumination conditions for reproducing the current transfer pattern and the target pattern can also be represented as bitmaps, and the difference between these illumination conditions can be obtained by subtraction of the bitmaps. In this case, however, a negative value may occur at a certain location in the bitmap obtained after the subtraction. After the subtraction result is added to the current first illumination condition, the location which bears the information of the subtraction result may, in turn, have a negative value. a negative value, which may result in errors, when the processing such as replacement with zero is used, which may result in errors. On the other hand, assume that two virtual illumination conditions for reproducing the current transfer pattern and the target pattern are represented by numeric values (parameters). In this case, these numeric values represent the overall illumination and are therefore less likely to generate a negative value when adding the differences to the current first illumination condition.

Resist computation is used as a mathematical model for obtaining the contour of a transfer pattern herein. However, as in a linear pattern having densely populated evaluation points, when there is little difference between the results of optical computation and resist computation, optical image computation may be used in order to shorten the computation time.

In the first embodiment, target patterns are set under one type of focus condition. These target patterns are normally set under a best focus condition. However, when an illumination condition for reproducing the target pattern on the premise of a best focus condition is used under a defocus condition, this may lead to a large deviation from the target pattern. To prevent this, in a second embodiment, an illumination condition is detected which allows the defocus amount to have a wide range in which a deviation from the contour of the target pattern falls within an allowable range. FIG. 4 describes graph lines (alternate long and short dashed lines) that fall within a certain allowable range of a dimension error from a target pattern in the upper and lower vicinities of a graph line, which describes a targeted transfer pattern, indicated by a solid line. An illumination condition which allows the target pattern to fall within the range indicated by alternate long and short dashed lines is detected. Note that in FIG. 4, the current transfer pattern is indicated by a dotted line.

Figure 5:
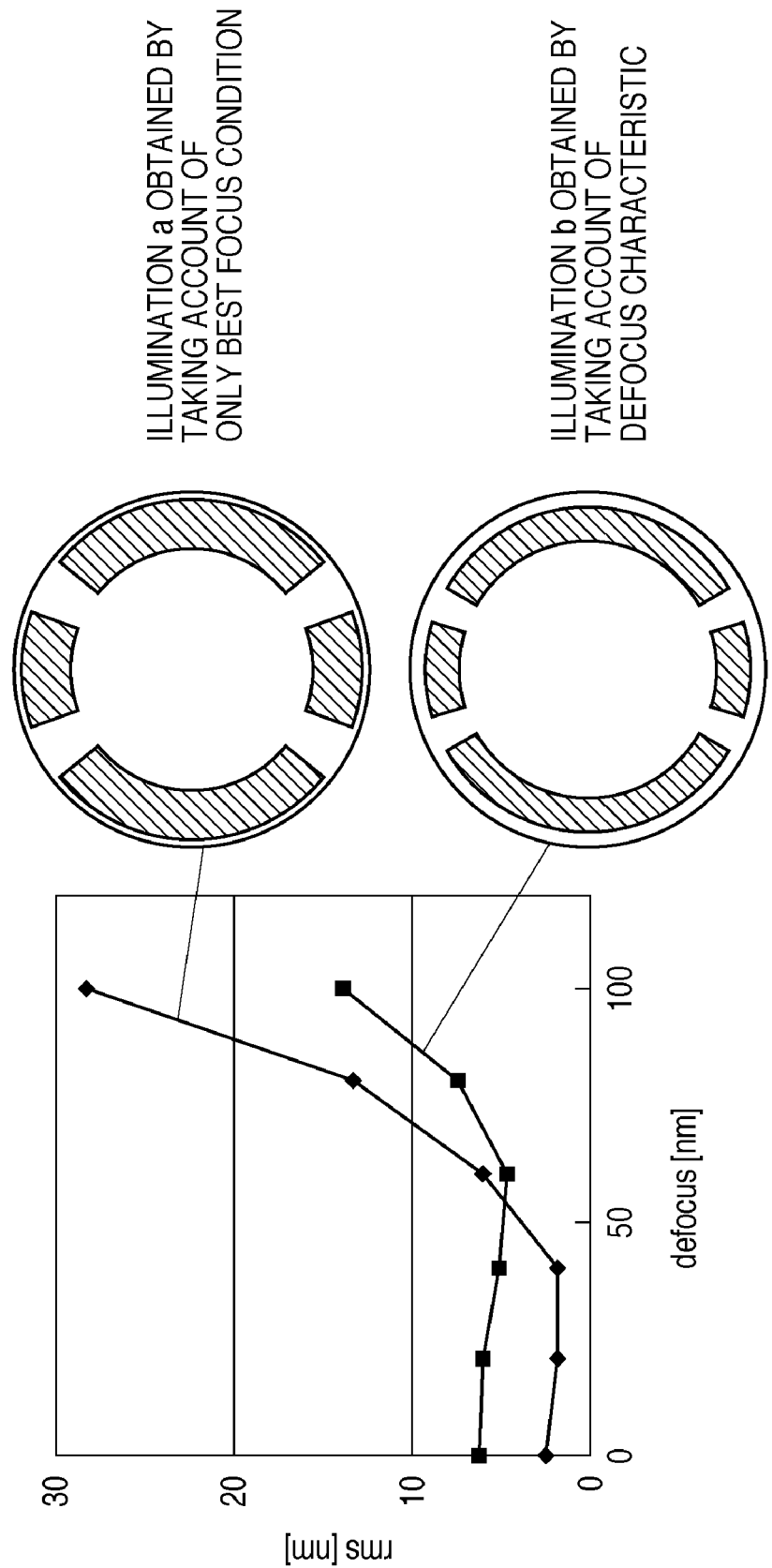
FIG. 5 is a graph showing the optimization result obtained by setting only the dimension value under a best focus condition as a target, and that obtained by taking account of defocus.

A method of detecting an illumination condition which allows the defocus amount to have a wide range is as follows. A transfer pattern is calculated for each illumination condition being detected in an optimization method. The RMS of the differences from the target dimension values (a solid line in FIG. 4) at respective evaluation points is computed. The defocus characteristic of the RMS value is calculated and graphed. The range of the defocus amount (DOF), in which the RMS is smaller than a predetermined value, is calculated. The illumination condition is optimized such that the calculated DOF value is maximum. FIG. 5 shows the optimization result obtained by setting only the dimension value under a best focus condition as a target, and that obtained by taking account of defocus. The RMS in illumination a is small under a best focus condition, but increases with an increase in defocus. In contrast to this, the RMS in illumination b is larger than that in the illumination a under a best focus condition, but increases more moderately with an increase in defocus than in the illumination a.

Whether to select the illumination a or b is determined based on whether a process of manufacturing a device gives priority to a high-precision operation with a narrow manufacturing margin or with a wide manufacturing margin. Since a wide manufacturing margin is generally of greater importance, the illumination b which allows defocus to have a wide range is selected in many cases.

Figure 6:
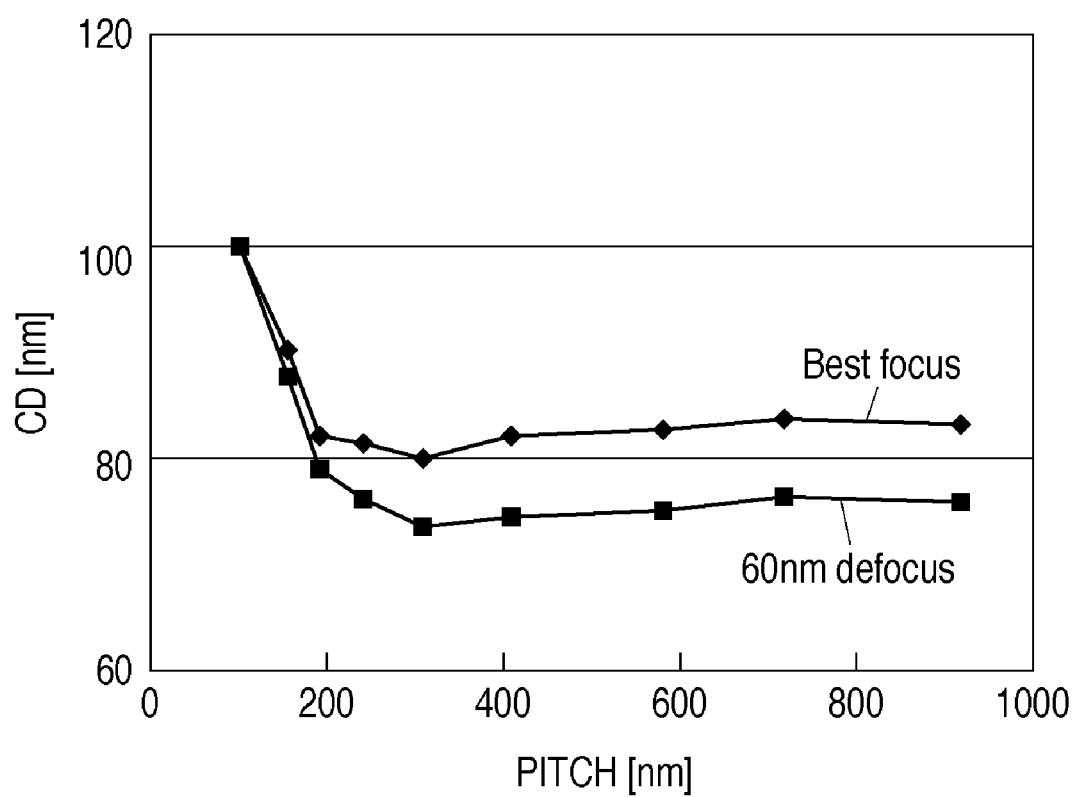
FIG. 6 is a graph showing the optimization result obtained by setting only the dimension value under a best focus condition as a target, and that obtained by taking account of defocus.

In the first embodiment, the patterning result of a targeted transfer pattern obtained under one type of focus condition is taken into consideration. However, in a third embodiment, an illumination condition which attains a target pattern is determined by referring to the patterning results of a certain targeted transfer pattern obtained under a plurality of different focus conditions. FIG. 6 shows the patterning results of an OPE evaluation pattern obtained under a best focus condition and a 60-nanometer defocus condition. Each of these two conditions yield two transfer results: the transfer result obtained under an illumination condition for reproducing the current transfer pattern, and that obtained under an illumination condition for reproducing the target pattern. Based on these transfer results, the illumination condition is optimized.

Figure 7:
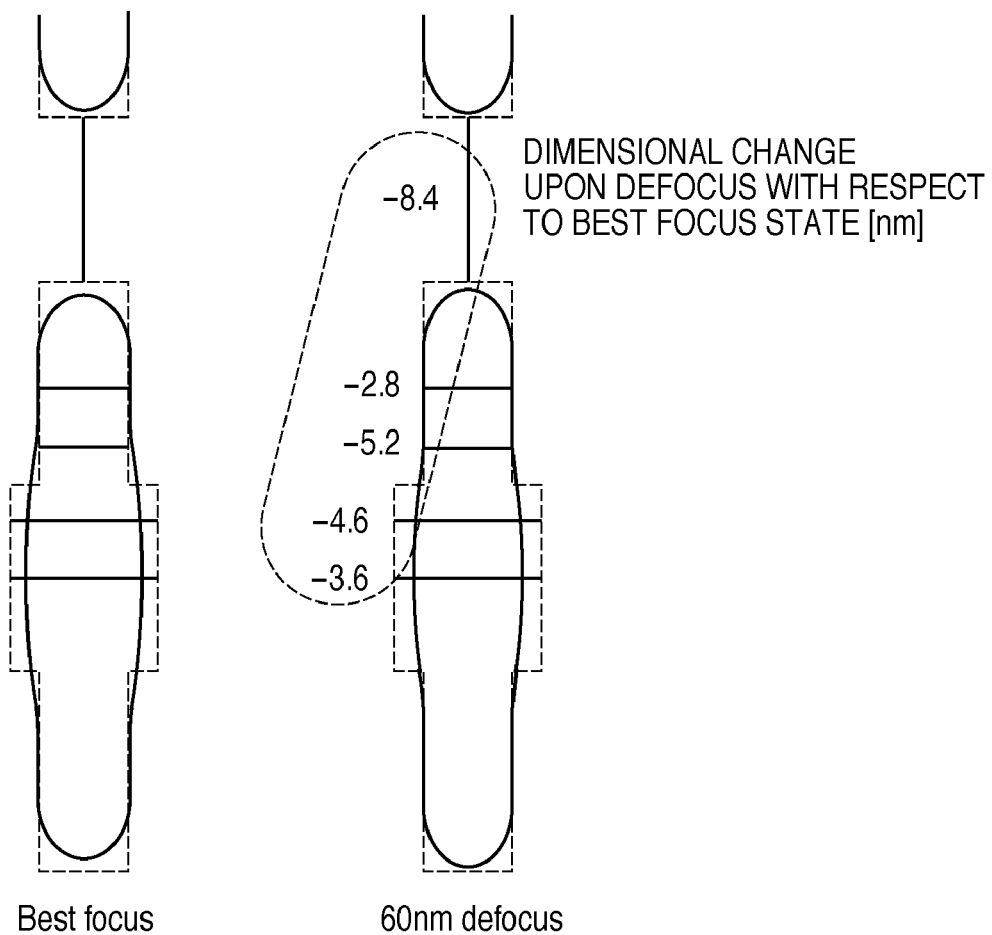
FIG. 7 is a view showing the optimization result obtained by setting only the dimension value under a best focus condition as a target, and that obtained by taking account of defocus.

FIG. 7 shows transfer patterns obtained under the illumination condition determined by taking account of the transfer results of a two-dimensional pattern obtained under a best focus condition and a 60-nanometer defocus condition. Because it is hard to visually check the dimensional difference between the two-dimensional patterns corresponding to a best focus condition and a defocus condition, FIG. 7 numerically describes that dimensional difference.

Figure 8A:
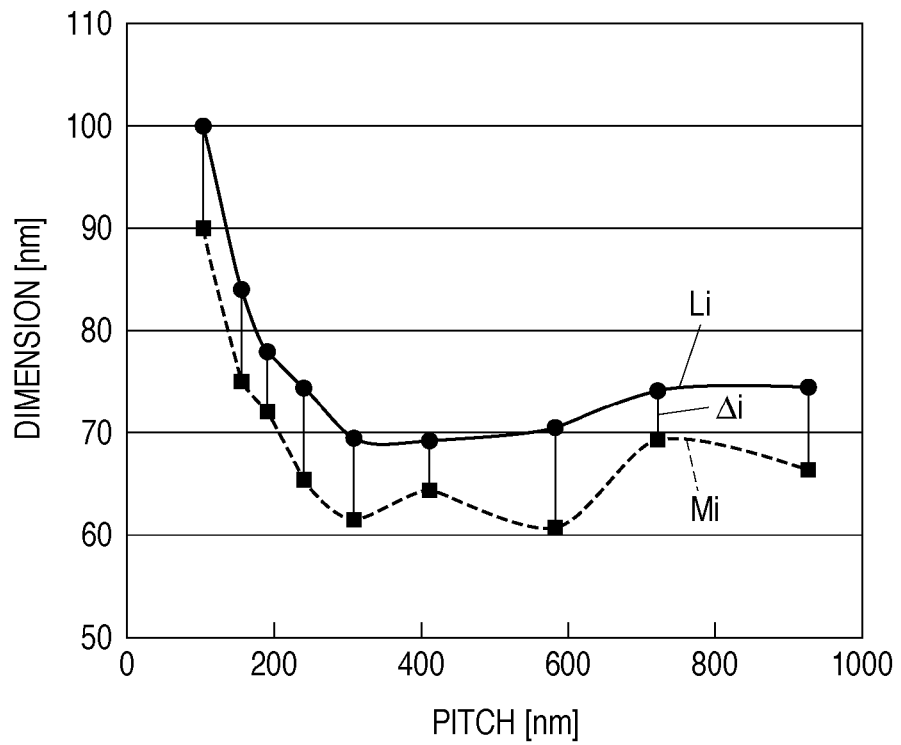
FIG. 8A is a graph showing a transfer pattern and a target pattern.

A case in which a conceptual method as in the first embodiment is performed by OPE evaluation will be explained in a fourth embodiment. First, a difference $\Delta i$ between a dimension $Li$ ($i=1, \ldots, n$) of a target pattern and a dimension $Mi$ of the current transfer pattern (first pattern) is calculated for each evaluation point. In FIG. 8A, $\Delta i$ is indicated by a vertical line.

Figure 8B:
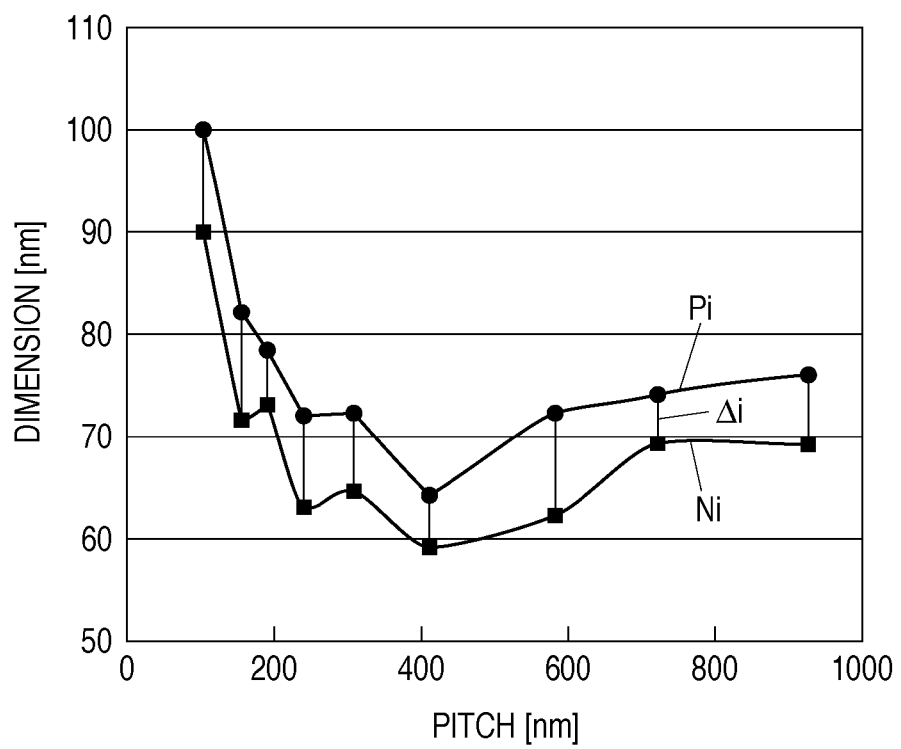
FIG. 8B is a graph showing a virtual transfer pattern transferred by illumination for reproducing the transfer pattern and the target pattern.

A resist image of a virtual transfer pattern (second pattern) transferred under a first illumination condition A used currently is computed, and the dimension at each evaluation point is determined as $Ni$. $Ni$ has a value slightly different from $Mi$ due to, for example, a resist computation error and a deviation between the numerical definition of the illumination mode and the setting of an actual exposure apparatus. Next, $Pi=Ni+\Delta i$ is calculated. FIG. 8B describes $Pi$ and $Ni$. The length of a vertical line indicated by $\Delta i$ in FIG. 8B is equal to that of a vertical line indicated by $\Delta i$ in FIG. 8A.

A virtual fifth illumination condition B for reproducing a virtual target pattern is obtained by adopting the above-mentioned mathematical model assuming that the third pattern having the dimension $Pi$ as a virtual target pattern. The dimension $Pi$ of the virtual target pattern is different from the dimension $Li$ of the target pattern. This is accounted for by, for example, a resist computation error generated between actual patterning and simulation, and a deviation between the numerical definition of the illumination mode and the setting of an actual exposure apparatus. The practical application of the fifth illumination condition B optimized in order to reproduce the virtual target pattern having the dimension Pi cancels the above-mentioned errors and therefore leads to a correct result.

Figure 8C:
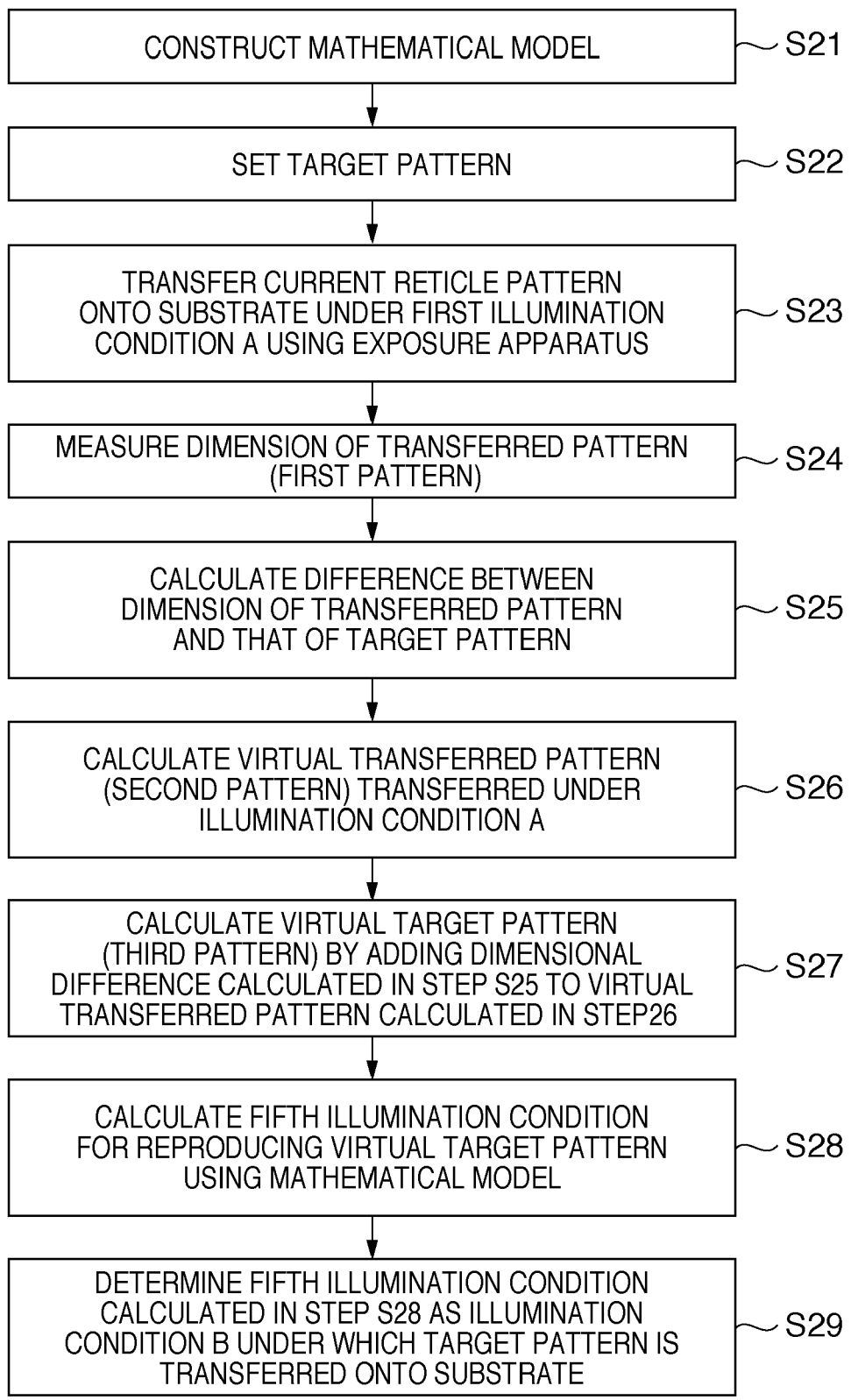
FIG. 8C is a flowchart showing a sequence of determining the illumination condition under which a target pattern is transferred.

FIG. 8C is a flowchart showing a sequence of determining a fifth illumination condition B which attains a virtual target pattern (third pattern). Steps S21 to S24 are the same as steps S11 to S14, respectively in FIG. 1C, and a description thereof will not be given.

In step S25, the computer calculates a difference $\Delta i = Li - Mi$ between a dimension Li of the target pattern and a dimension Mi of the current transfer pattern (first pattern) at each of a plurality of evaluation points. In step S26, the computer calculates, by resist computation, a dimension Ni of a virtual transfer pattern (second pattern) transferred under the current first illumination condition A. In step S27, the computer adds the difference $\Delta i$ to the dimension Ni of the virtual transfer pattern (second pattern) to calculate $Ni + \Delta i = Pi$, where Pi is the dimension of a virtual target pattern (third pattern).

In step S28, using a mathematical model, the computer calculates a fifth illumination condition B for reproducing the virtual targeted transfer pattern (third pattern) having the dimension Pi. Step S26 is a second calculation step of calculating a virtual second pattern, and step S28 is a third calculation step of calculating a virtual fifth illumination condition. The mathematical model can be, for example, a model which includes a genetic algorithm or a Monte Carlo algorithm. In step S29, the computer determines the fifth illumination condition B as the illumination condition under which the target pattern is transferred onto a substrate.

A program for executing the process from step S22 to step S29 can be stored in a storage medium of the computer. With this operation, the computer can execute a process for determining the illumination condition under which a target pattern is transferred onto a substrate from step S22 to step S29. Also, the computer can execute the process for determining the illumination condition by reading the program code from a recording medium which records the program.

The fourth embodiment can similarly adopt the following methods described in the second and third embodiments: a method of detecting an illumination condition which allows the defocus amount to have a wide range in which a targeted transfer pattern falls within a certain dimensional allowance; and a method of referring to the results of transferring one transfer pattern under a plurality of focus conditions.

Figure 9:
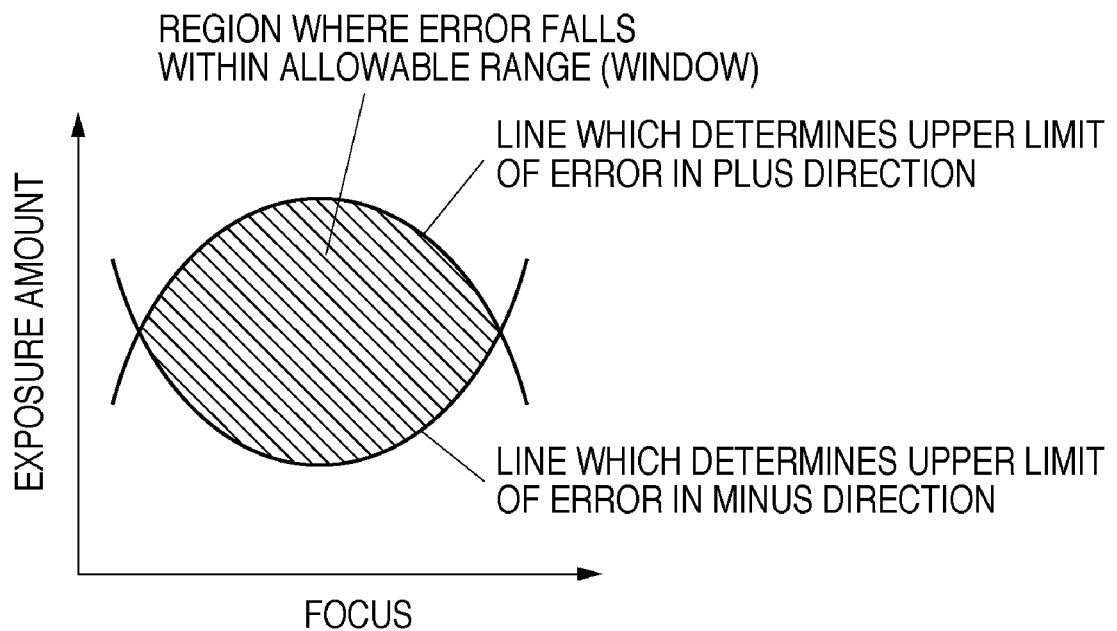
FIG. 9 is a graph showing the allowable range of both the exposure amount and the focus.

In the second to fourth embodiments, illumination allowing the defocus amount to have a wide range in which a target pattern falls within a certain dimensional allowance is detected. In a fifth embodiment, an illumination condition that allows both the exposure amount and the focus to have a wide allowable range (commonly called a window) is detected. One method is to calculate a region where an error from the target dimension falls within an allowable range in a two-dimensional space defined by the exposure amount and the focus, and optimize the illumination condition such that the calculated region has a maximum area, as shown in FIG. 9. Alternatively, in one application example of the fifth embodiment, an illumination condition allowing the exposure amount to have a wide range in which a dimension error falls within an allowable range may be detected. In the third embodiment, an optimum illumination condition is determined by referring to the results of transferring one transfer pattern under a plurality of focus conditions. Instead, the illumination condition can also be determined by referring to the transfer results obtained using a plurality of exposure amounts in place of a plurality of focus conditions.

An exemplary method of manufacturing devices such as a semiconductor integrated circuit device and a liquid crystal display device will be explained next. The devices are manufactured by an exposure step of exposing a substrate using the illumination condition determined using the above-mentioned determining method, a development step of developing the substrate exposed in the exposure step, and known subsequent steps of processing the substrate developed in the development step. The known subsequent steps include, for example, etching, resist removal, dicing, bonding, and packaging steps.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-278611, filed Oct. 29, 2008, which is hereby incorporated by reference herein in its entirety.

What is claimed is:

1. A method of transferring a pattern of a reticle onto a substrate, the method comprising:

setting a target pattern to be formed on the substrate using the reticle;

obtaining a first pattern transferred onto a substrate by exposure using the reticle and a first illumination condition;

calculating, a virtual second illumination condition under which the target pattern is transferred onto a substrate using the reticle, and a virtual third illumination condition under which the first pattern is transferred onto a substrate using the reticle, using mathematical models each of which defines a relationship between an illumination condition and a virtual pattern transferred onto a substrate using the illumination condition;

determining a fourth illumination condition, obtained by adding a difference between the calculated second illumination condition and third illumination condition to the first illumination condition, as an illumination condition under which the target pattern is transferred onto a substrate using the reticle; and transferring the pattern of the reticle onto the substrate by illuminating the reticle using the determined illumination condition.

2. The method according to claim 1, wherein in the calculating, the second illumination condition, which allows at least one of an exposure amount and a defocus amount to have a wide range in which a deviation from a contour of the target pattern falls within an allowable range, is calculated.

3. The method according to claim 1, wherein in the setting, a plurality of target patterns having different focus conditions are set, in the obtaining, a plurality of first patterns are obtained under a plurality of focus conditions, in the calculating, the second and third illumination conditions are calculated for each of the plurality of focus conditions, and in the determinating, an illumination condition, under which the target pattern is transferred onto a substrate using the reticle, is determined based on a plurality of fourth illumination conditions respectively corresponding to the plurality of focus conditions.

4. A method of transferring a pattern of a reticle onto a substrate, the method comprising:

setting a target pattern to be formed on a substrate using the reticle;

obtaining a first pattern transferred onto a substrate by exposure using the reticle and a first illumination condition;

calculating, a virtual second pattern transferred onto a substrate by exposure using the reticle and the first illumination condition, using a mathematical model which defines a relationship between an illumination condition and a virtual pattern transferred onto a substrate using the illumination condition;

calculating, using the model, a virtual fifth illumination condition under which a virtual third pattern obtained by adding a difference between the target pattern and the first pattern to the calculated second pattern is transferred onto a substrate by exposure using the reticle;

determining the calculated fifth illumination condition as an illumination condition under which the target pattern is transferred onto a substrate using the reticle; and transferring the pattern of the reticle onto the substrate by illuminating the reticle using the determined illumination condition.

5. The method according to claim 4, wherein
in the calculating, the fifth illumination condition, which allows at least one of an exposure amount and a defocus amount to have a wide range in which a deviation from a contour of the target pattern falls within an allowable range, is calculated.

6. The method according to claim 4, wherein
in the setting, a plurality of target patterns having different focus conditions are set, in the obtaining, a plurality of first patterns are obtained under the plurality of focus conditions, in the calculating, the fifth illumination condition is calculated for each of the plurality of focus conditions, and in the determining, an illumination condition under which the target pattern is transferred onto a substrate using the reticle is determined based on the plurality of fifth illumination conditions respectively corresponding to the plurality of focus conditions.

7. A computer readable storage medium storing a computer-executable program causing a computer to perform a method comprising:

setting a target pattern to be formed on a substrate using the reticle;

obtaining a first pattern on a substrate using the reticle and a first illumination condition;

calculating, a second illumination condition under which the target pattern is transferred onto a substrate using the reticle, and a third illumination condition under which the first pattern is transferred onto a substrate using the reticle, using mathematical models each of which defines a relationship between an illumination condition and a virtual pattern transferred onto a substrate using the illumination condition; and determining a fourth illumination condition, obtained by adding a difference between the calculated second illumination condition and third illumination condition to the first illumination condition, as an illumination condition under which the target pattern is transferred onto a substrate using the reticle.

8. A computer readable storage medium storing a computer-executable program of instructions for causing a computer to perform a method comprising:

setting a target pattern to be formed on a substrate using the reticle;

obtaining a first pattern on a substrate using the reticle and a first illumination condition;

calculating, a virtual second pattern transferred onto a substrate using the reticle and the first illumination condition, using a mathematical model which defines a relationship between an illumination condition and a virtual pattern transferred onto a substrate using the illumination condition;

calculating, using the model, a fifth illumination condition under which a virtual third pattern obtained by adding a difference between the target pattern and the first pattern to the calculated second pattern is transferred onto a substrate using the reticle; and determining the calculated fifth illumination condition as an illumination condition under which the target pattern is transferred onto a substrate using the reticle.

9. A method comprising:
determining an illumination condition of a reticle;
exposing a substrate while illuminating the reticle under the determined illumination condition;
developing the exposed substrate; and
processing the developed substrate to manufacture a device,
wherein
the determining includes
setting a target pattern to be formed on a substrate using the reticle,
obtaining a first pattern transferred onto a substrate using the reticle and a first illumination condition,
calculating, a second illumination condition under which the target pattern is transferred onto a substrate using the reticle, and a third illumination condition under which the first pattern is transferred onto a substrate using the reticle, using mathematical models each of which defines a relationship between an illumination condition and a virtual pattern transferred onto a substrate using the illumination condition, and
determining a fourth illumination condition, obtained by adding a difference between the calculated second illumination condition and third illumination condition to the first illumination condition, as an illumination condition under which the target pattern is transferred onto a substrate using the reticle.

10. A method comprising:
determining an illumination condition of a reticle;
exposing a substrate while illuminating the reticle under the determined illumination condition;
developing the exposed substrate; and
processing the developed substrate to manufacture a device,
wherein
the determining includes
setting a target pattern to be formed on a substrate using the reticle,
obtaining a first pattern transferred onto a substrate using the reticle and a first illumination condition,
calculating, a virtual second pattern transferred onto a substrate using the reticle and the first illumination condition, using a mathematical model which defines a relationship between an illumination condition and a virtual pattern transferred onto a substrate using the illumination condition, calculating, using the model, a fifth illumination condition under which a virtual third pattern obtained by adding a difference between the target pattern and the first pattern to the calculated second pattern is transferred onto a substrate using the reticle, and determining the calculated fifth illumination condition as an illumination condition under which the target pattern is transferred onto a substrate using the reticle.

* * * * *